United States Patent [19]

Jennion et al.

[11] Patent Number: 5,652,524
[45] Date of Patent: Jul. 29, 1997

[54] BUILT-IN LOAD BOARD DESIGN FOR PERFORMING HIGH RESOLUTION QUIESCENT CURRENT MEASUREMENTS OF A DEVICE UNDER TEST

[75] Inventors: Mark W. Jennion, Chester Springs; Joseph H. Fell, III, East Fallowfield; Paul H. Selby, III, Norristown; Joseph J. Scorsone, Broomall, all of Pa.

[73] Assignee: Unisys Corporation, Blue Bell, Pa.

[21] Appl. No.: 547,265

[22] Filed: Oct. 24, 1995

[51] Int. Cl.$^6$ .................................................. G01R 31/06
[52] U.S. Cl. ..................... 324/765; 324/755; 324/158.1
[58] Field of Search .......................... 324/73.1, 158.1, 324/765; 371/22.1, 22.5, 22.6, 15.1, 25.1; 437/8; 365/201

[56] References Cited

U.S. PATENT DOCUMENTS

| | | |
|---|---|---|
| 3,676,777 | 7/1972 | Charters . |
| 3,895,297 | 7/1975 | Jarl . |
| 4,631,724 | 12/1986 | Shimizu .................................. 365/201 |
| 4,712,058 | 12/1987 | Branson et al. . |
| 4,746,855 | 5/1988 | Wrinn . |
| 4,849,691 | 7/1989 | Siefers . |
| 5,025,344 | 6/1991 | Maly et al. .............................. 371/22.5 |
| 5,032,789 | 7/1991 | Firooz et al. . |
| 5,057,774 | 10/1991 | Verhelst et al. ........................ 371/22.5 |
| 5,101,149 | 3/1992 | Adams et al. . |
| 5,101,151 | 3/1992 | Beaufils et al. . |
| 5,101,153 | 3/1992 | Morong, III . |
| 5,146,161 | 9/1992 | Kiser . |
| 5,157,326 | 10/1992 | Burnsides . |
| 5,285,152 | 2/1994 | Hunter .................................... 324/73.1 |
| 5,294,883 | 3/1994 | Akiki et al. . |
| 5,371,457 | 12/1994 | Lipp . |
| 5,392,293 | 2/1995 | Hsue ..................................... 324/158.1 |
| 5,404,099 | 4/1995 | Sahara . |
| 5,406,217 | 4/1995 | Habu . |
| 5,412,315 | 5/1995 | Tsuda . |
| 5,414,352 | 5/1995 | Tanase . |
| 5,559,445 | 9/1996 | Eaddy et al. ......................... 324/158.1 |

*Primary Examiner*—Vinh P. Nguyen
*Attorney, Agent, or Firm*—John B. Sowell; Mark T. Starr; John F. O'Rourke

[57] ABSTRACT

An improved load board design having a generic test circuit integrated into the load board capable of functioning with varying devices under test and requires little to no wiring. The test circuit is located in a fixed and optimal position of the load board with relation to the DUT. In a preferred embodiment, the test circuit is a quiescent test circuit for interfacing an integrated circuit tester to the DUT. The quiescent test circuit is capable of supplying high powered voltage to a DUT while the DUT's desired internal state is reached. At this point, the integrated circuit tester, sends an active select signal to the quiescent test circuit instantaneously deselecting the high-powered voltage supply to the DUT and selecting the integrated circuit tester's parametric measurement unit for powering the DUT. The integrated circuit tester, through a parametric measurement unit is capable of measuring the quiescent current of the DUT, while powering the DUT.

4 Claims, 6 Drawing Sheets

BUILT-IN LOAD BOARD DESIGN FOR PERFORMING HIGH RESOLUTION QUIESCENT CURRENT MEASUREMENTS OF A DEVICE UNDER TEST

CROSS REFERENCE

The following application of common assignee contains some common disclosure, and is believed to have an effective filing date with that of the present application, entitled "Circuit for Measuring Quiescent Current," Ser. No. 08/547, 353, incorporated herein by reference.

BACKGROUND OF THE INVENTION

1. Field of the Invention

The present invention relates generally to load boards, and more specifically to a circuit integrated into a load board for performing high resolution quiescent current measurements of a CMOS integrated circuit (IC) device under test (DUT).

2. Related Art

In an engineering environment, it is important to be able to test a prototype electronic device (known as the DUT), such as a processor chip, before it is sent out to mass manufactured. A load board allows power supply and logic pins of the DUT to be connected to an IC tester for reliability testing of the DUT.

A short coming with current load board designs is that they occasionally need custom designed test circuits for increasing performance or enhancing test coverage. It usually includes adding interconnect or altering existing interconnect between the DUT, IC tester and corresponding power systems. Consequently, it is necessary to build particular test circuits from scratch for each new implementation of a DUT. This involves placing test circuit components on the surface of the load board in relation to the DUT, and wiring in the desired interconnect changes, creating an opportunity for wiring mistakes and shorts or opens.

Furthermore, due to the varying size, pin outputs, and nature of DUTs, it is often time consuming to design custom test circuits to connect IC testers to the DUT on the load board. Another problem associated with current load board designs, is that quite often, it is not possible to place the test circuit in optimal relation to the DUT. As a result, long inductive connections and unshielded interconnections are prevalent. This often compromises the integrity of the test circuit and test results.

Therefore, what is needed, is a generic test circuit capable of functioning with varying DUTs that can be easily manufactured with the load board and requires little to no wiring. A test circuit that is designed to be located in a fixed and optimal position on the load board is also needed.

SUMMARY OF THE INVENTION

The present invention relates to a generic test circuit integrated into a load board capable of functioning with varying DUTs and requires little to no wiring. The test circuit is located in a fixed and optimal position of the load board with relation to the DUT.

In a preferred embodiment, the test circuit is a quiescent test circuit for interfacing an integrated circuit tester to the DUT. The quiescent test circuit is capable of supplying high powered voltage to a DUT while the DUT's desired internal state is reached. At this point, the integrated circuit tester, sends an active select signal to the quiescent test circuit instantaneously deselecting the high-powered voltage supply to the DUT and selecting the integrated circuit tester's parametric measurement unit for powering the DUT. The integrated circuit tester, through a parametric measurement unit is capable of measuring the quiescent current of the DUT, while powering the DUT.

A further feature of the present inventions is that the quiescent circuit has segmented voltage planes isolating the test circuit's current from that of the DUT.

Another feature of the present invention is that the integrated quiescent circuit in the load board provides space reduction, improved performance, reliability and repeatability. This is achieved because there are direct connections to the load board's internal planes avoiding long lead lengths.

DETAILED DESCRIPTION OF THE PREFERRED EMBODIMENTS

Figure 1:
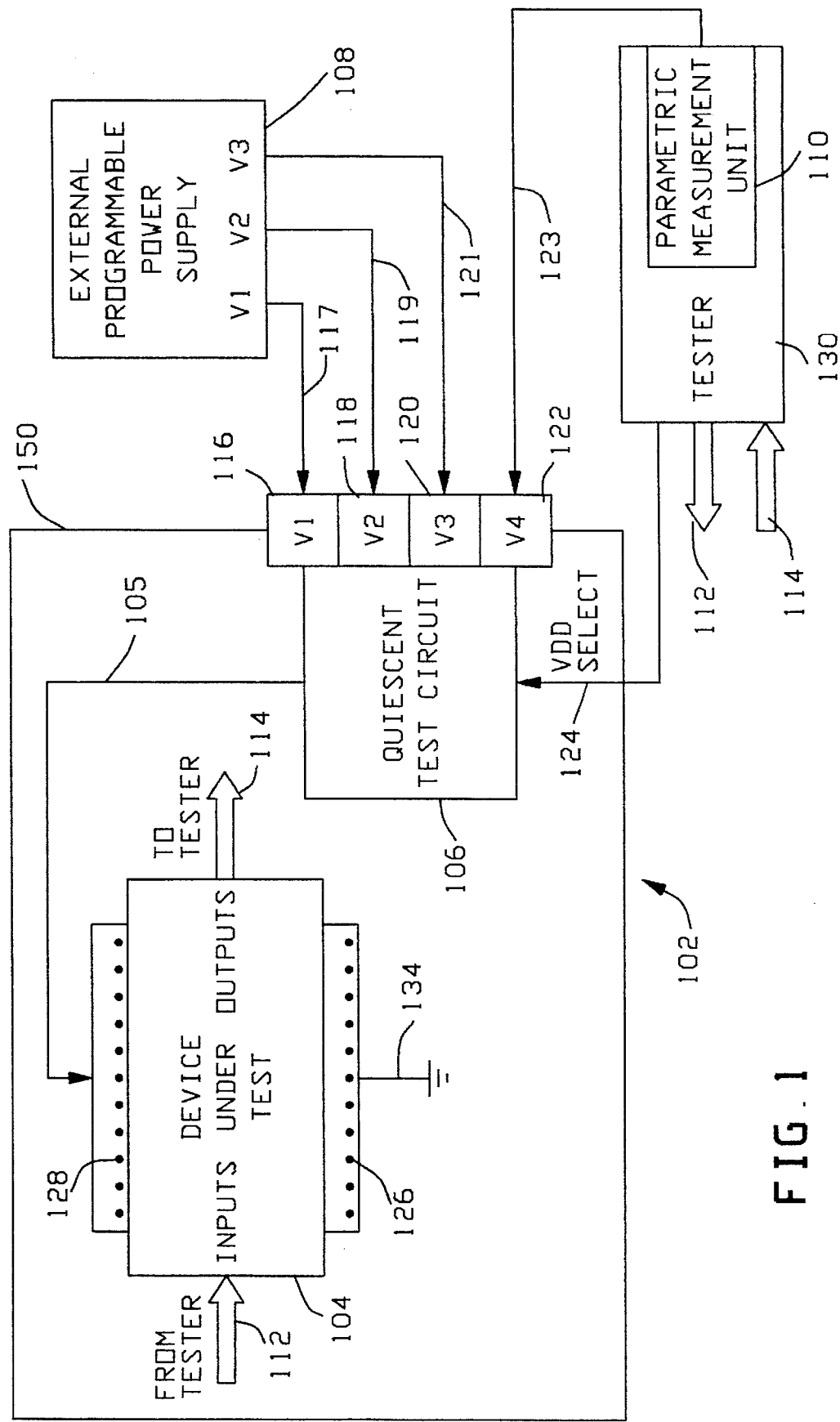
FIG. 1 is a high-level block diagram of a load board for testing a Device Under Test, in accordance with a preferred embodiment of the present invention.

FIG. 1 is a high-level block diagram of a load board 102 for testing a Device Under Test (DUT) 104, in accordance with a preferred embodiment of the present invention.

The load board 102 is typically a multi-laminate board having separate conductive signal and power layers to provide separate electrical connections with respective signal pins (male pins not shown, see connection input and output lines 112, 114) and power pins (represented as 128) of the DUT 104.

Viewing FIG. 1 is an external programmable power supply 108, an integrated circuit tester 130 having a Direct Current parametric measurement unit 110, and a quiescent test circuit 106.

The quiescent test circuit 106 is integrated (built-in) into the multi-layer load board 102. The quiescent test circuit 106 is positioned centrally and adjacent to one of the longitudinal ends 150 of the load board 102. Quiescent test circuit 106 measures quiescent current consumption of the DUT 104 via power plane connections 105 to the DUT 104. According to the present invention, quiescent current is directly measured as opposed to calculated from measured voltage levels of DUT 104; using the sensitive voltage supply V4 from the parametric measurement unit 110 instead of high powered and varied voltage of the external programmable power supply.

External elements such as the external power supply 108 and the tester 130 are easily connected to the load board 102 via voltage connections V1–V4 of the quiescent circuit 106. The external programmable supply 108 is connected to connections V1–V3 via interconnections 117, 119, and 121. The tester 130 via the parametric measurement unit 110 is connected to connection V4 122 on the load board 102 via interconnection line/wire 123.

The integrated circuit tester 130 interfaces to the DUT 104 via load board 102. The tester 130 also interfaces to quiescent test circuit 106 via VDD select 124. The tester 130 is connected to pins of the DUT 104 via input bus 112 and output bus 114. Tester 130 receives quiescent current measurements from the quiescent test circuit 106 as measured by the DC parametric unit 110. In the preferred embodiment tester 130 is a Logic Master XL, High-Performance Test Station of Integrated Measurement Systems, Incorporated, Beaverton, Oreg., USA.

As understood in the art, DUT 104 includes power pins 128 and ground pins 126. Power pins 128 receive power directly from power plane connections 105 in the load board 102. Ground pins 126 are directly connected to a ground plane 134 in the load board 102.

Figure 2:
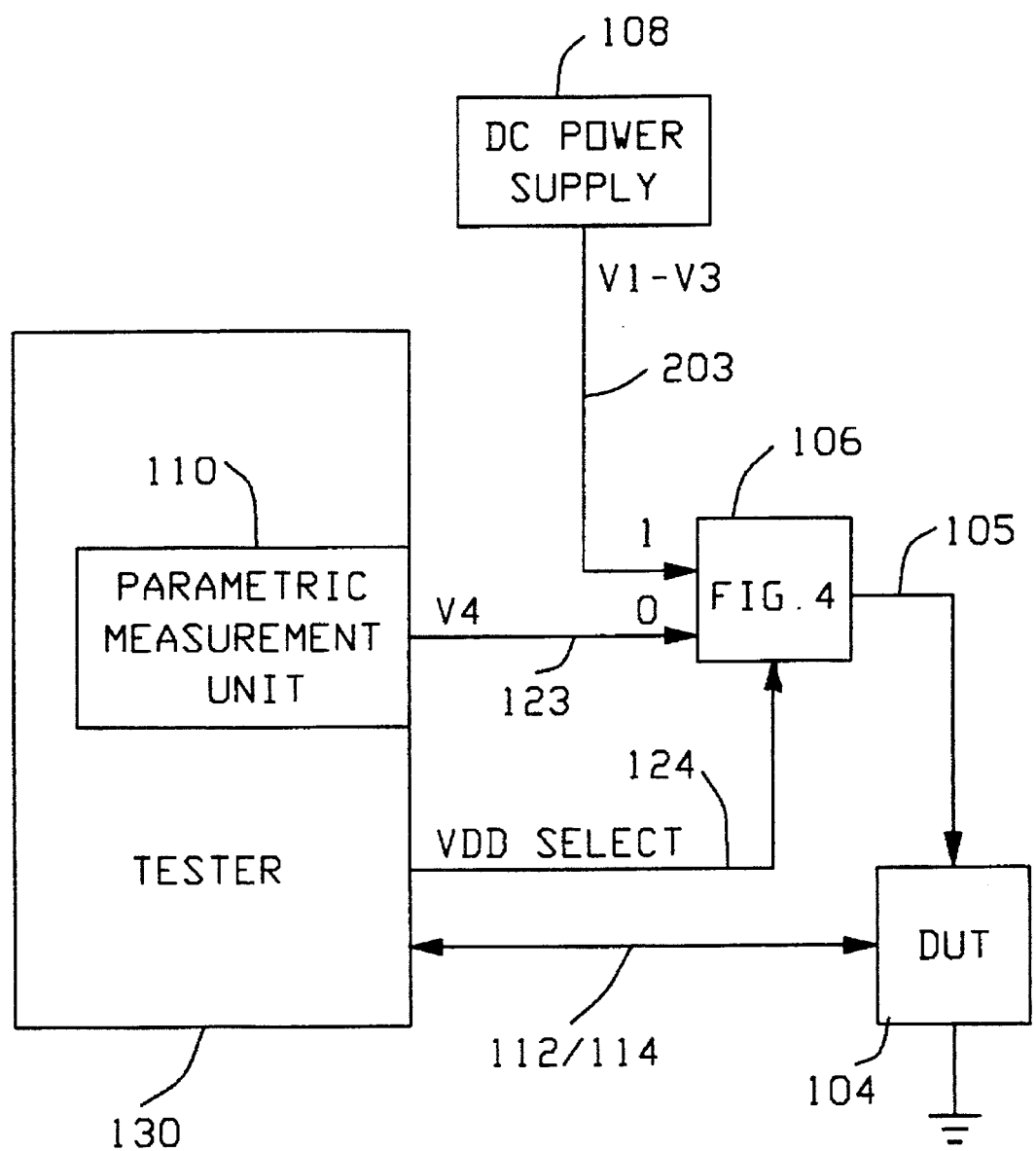
FIG. 2 is a block diagram illustrating a combination interface of the integrated circuit tester, the quiescent test circuit, and the Device Under Test shown in FIG. 1.

FIG. 2 is a block diagram illustrating a combination interface of the integrated circuit tester 130, the quiescent test circuit 106, and the Device Under Test 104 as shown in FIG. 1. FIG. 2 illustrates how one of two power supplies V1 or V4 is connected to DUT 104 via power plane 105. Tester 130 initially selects DC power supply 108 V1, via VDD select 124. Accordingly, V1 powers the DUT 104, which is a high power supply necessary during clocking operations to be described with reference to FIGS. 5 and 6. Tester 130 alternatively selects DC parametric measurement unit 110 as the power supply via V4, by changing the state of the signal input to VDD select 124. Accordingly, V4 powers the DUT 104, which is a low current power supply used for measuring high resolution static current consumption (quiescent current) of the DUT 104.

Power supplies V2 and V3 are not shown in this diagram, but are connected to quiescent test circuit 106.

Figure 3:
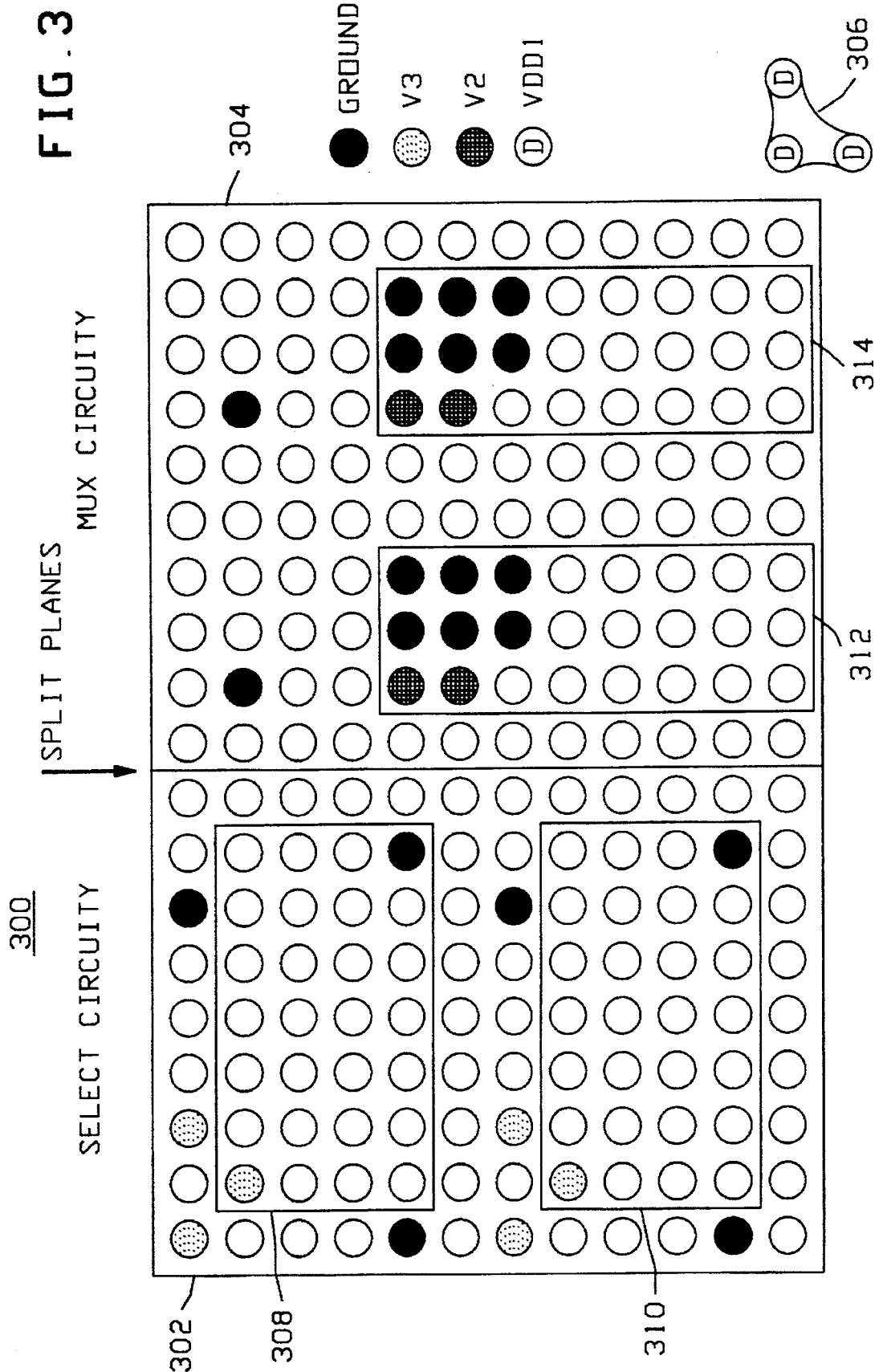
FIG. 3 is a footprint illustration of circuit components of the quiescent test circuit built into the load board 102.

Referring to FIG. 3, is a footprint 300 representing the components of the quiescent test circuit 106. Footprint 300 is a section of load board 102 shown in FIG. 1. Footprint 300 is split into two halves: (1) select circuitry 302, and (2) multiplexing (MUX) circuitry 304. Footprint 300 also includes a connection point or node 306 to the power plane connections 105.

Select circuitry 302 includes an open collector OR gate 308 and an open collector NOR gate 310. MUX circuitry 304 includes two independent high power JFET devices 312 and 314.

Select circuitry 302 components 308, 310 are powered by V3 via a V3 voltage plane in the load board 102. MUX circuitry 304 components 312, 314 are powered by V2 via a V2 voltage plane in the load board 102.

In a preferred embodiment, footprint 300 contains individual component footprints for components 308, 310, 312 and 314.

V1 voltage from the external power supply 108 and V4 voltage from the parametric measurement unit 110 are alternatively selected by select circuitry 302 to pass through MUX circuitry 304 to be connected across connection point 306 to power plane 105.

Segmented voltage planes V2 and V3 are employed to perform three functions: (1) to isolate current usage between the DUT 104 and the select circuitry 302 and MUX circuitry 304; (2) to enable direct connections to V2 and V3; and (3) to utilize noise immunity and high current capacity of internal power planes V2 and V3.

Figure 4:
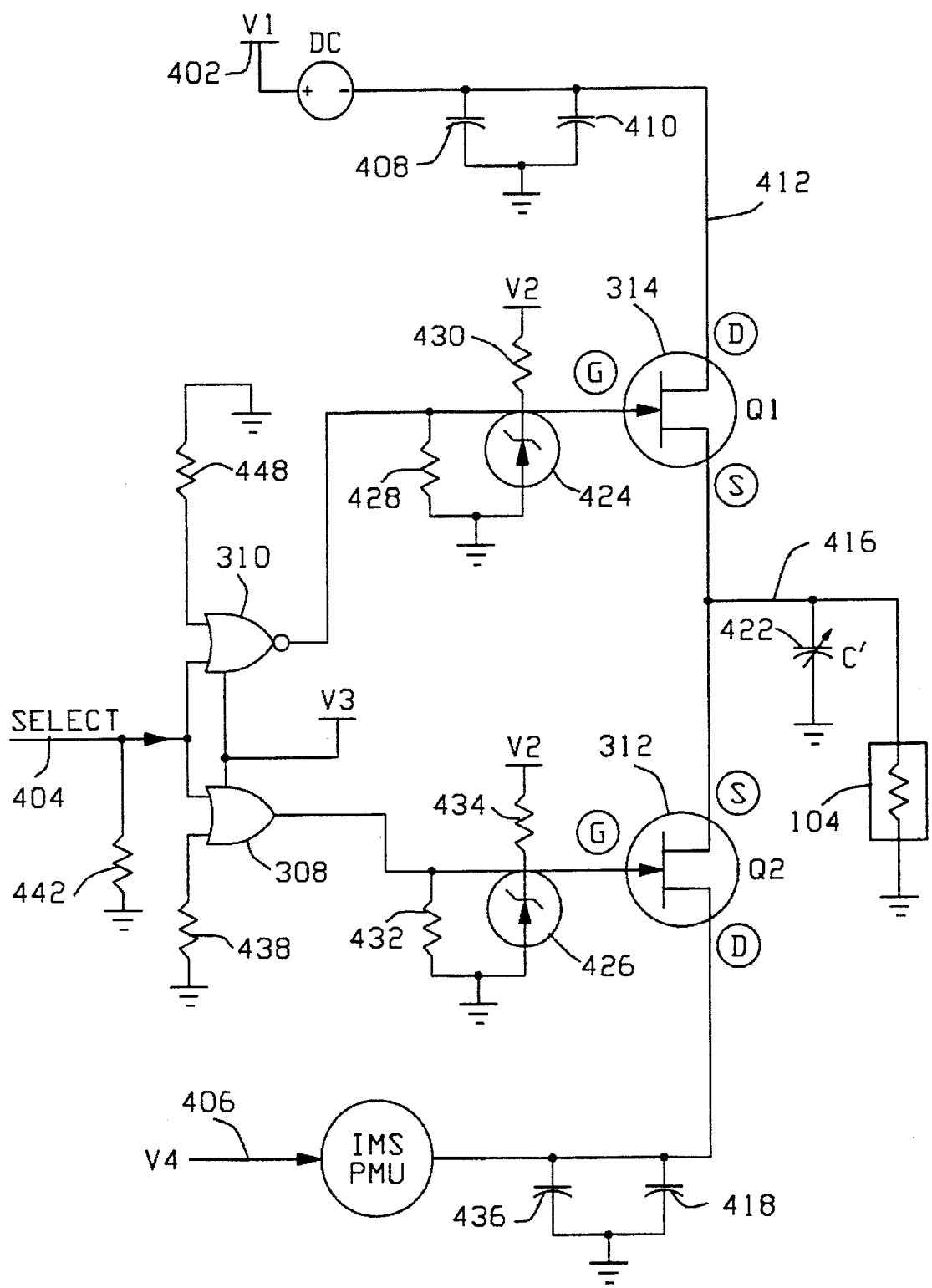
FIG. 4 is a circuit diagram of the quiescent test circuit according to a preferred embodiment of the present invention.

Referring to FIG. 4, is a circuit diagram of quiescent test circuit 106 according to a preferred embodiment of the present invention. Components 310, 308, 438, 448 and 442 make up select circuitry 302. Resistors 438, 448 and 442 are used for pull-downs to enable by-pass conditions. Notice that V3 is connected to open collector NOR and OR gates 308, 310.

MUX circuitry 304 includes JFETs 312 and 314, decoupling capacitors 408, 410, 436, 418, diodes 424, 426, and resistors 428, 430, 432 and 434. The decoupling capacitors, diodes and resistors act as performance enhancing devices. Notice that V2 is connected to positive side of resistors 430 and 434.

Capacitor 422 represents the variable capacitance level of load board 102, which be optimized according to the switching speed of the MUX circuitry 304.

Operationally, JFETs 312 and 314, serve as solid state switches to deliver one of two voltage sources V1 or V4. Only one of the JFETs 312 and 314 conduct at a time, with the only exception being a small amount of cross conduction that may occur during the time one JFET is turned off and the other JFET is turned on. Diodes 424 and 426 serve as zener clamps to absorb any voltage transients appearing at the gates of JFETs 312 and 314. Additionally, diodes 424, 426 protect the gates of JFETs 312, 314 should the maximum voltage supply be surpassed. In the preferred embodiment, the maximum recommended voltage is 15 volts.

Figure 5:
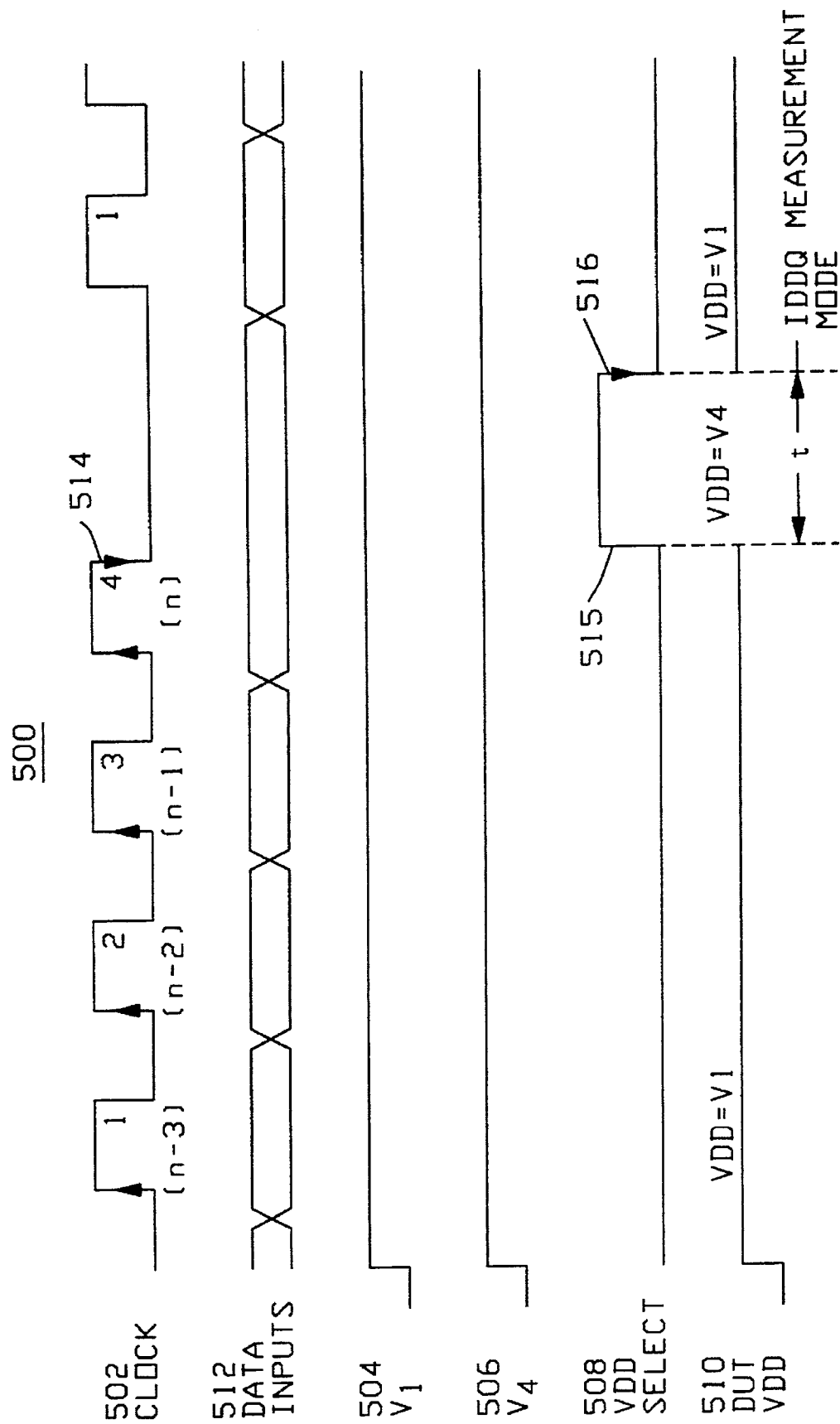
FIG. 5 is a representative and simplified timing diagram of an example typical quiescent current measurement cycle according to the present invention.
Figure 6:
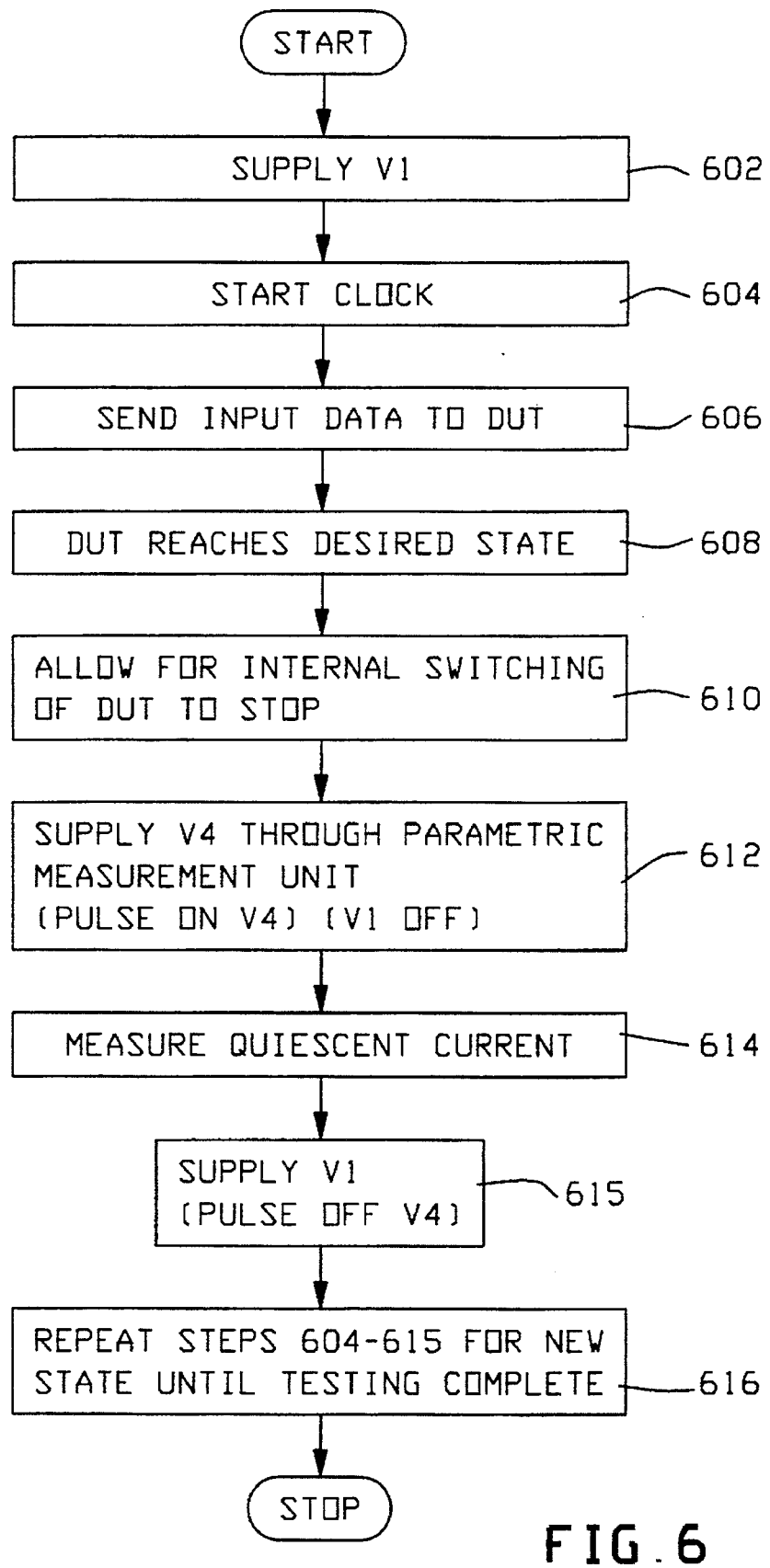
FIG. 6 is a flow chart illustrating operational steps of a typical quiescent current measurement cycle.

FIG. 5 is a representative and simplified timing diagram of a typical quiescent current measurement cycle 500 according to the present invention. Measurement cycle includes a clock 502, V1 504, V4, 506, VDD select 508, DUT VDD 510, and Inputs 512 to input pins 112. The quiescent test measurement cycle 500, will be described with reference to the flow diagram of FIG. 6 and elements shown from FIG. 1.

In steps 604–606 the quiescent measurement test begins by sending a predetermined set of data inputs 512 from the tester 130 to the DUT 104. The data inputs 512 are clocked or pulsed-in at the leading edges or rising edges of clock. N successive clock cycles 502 may be needed (typically ranging from 5-to-several thousand) to reach a desired combination of internal node states within the DUT 104. In the example of FIG. 5, there are four clock cycles N-3 through N before the desired internal node state of the DUT 104 is reached.

While clocking and input data occurs in steps 604 and 606, according to block 602, the tester 130 via the VDD select signal 508 (remains as logic zero), which selects V1 504 as voltage source to the DUT 104. While V1 is selected, large dynamic currents from internal switching typically occurs.

Next, in step 608, the DUT reaches a desired internal state. Before the quiescent current is measured, it is necessary to allow any remaining internal switching within the DUT 104 to settle out as indicated by block 610. This phase out period occurs shortly after the falling edge 512 of the Nth clock cycle of clock 502.

In step 612, after the falling edge of the Nth clock 514, the tester 130 via the VDD select signal 508, pulses to a logic 1 and selects V4 506 as the voltage source to the DUT 104. In other words, V4 506 is "pulsed-on" via VDD select going active 515, in step 612.

In step 614, during the high select signal 508, the parametric measurement unit 110, measures the quiescent current consumption of the DUT 104. It should be noted that either current consumption or voltage drops can be measured during step 614, but in the preferred embodiment current consumption is measured.

In step 615, when the tester 130 completes the quiescent current measurement, VDD select returns low 516 or, in other words VDD 508 is pulsed off 516 (inactive or logic zero). After a brief delay the clocking cycles for a new unique combination of internal node states is executed and the process 602–615 repeats.

It should be noted that if changes are made to the circuitry of the DUT, it is possible to perform testing without utilizing the parametric measurement unit 110. By default, VDD select 124 can be ignored (not used) or tri-stated. In this mode, the V1 power supply is always selected regardless of what is presented at the V4 122 input terminal of the quiescent circuit 106. In other words, the quiescent circuit 106 can effectively be made to look like it does not exist.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A load board having multi-level signal and power planes, for coupling pins of an integrated circuit device under test (DUT) to a conventional integrated circuit tester, comprising:

said load board having at least two separated portions each having a plurality of signal and power planes, a quiescent test circuit mounted on and integrated with a first portion of said multi-level load board such that said quiescent test circuit is contained on and electrically connected to its multilevel signal and power planes, said load board having means for mounting the device under test (DUT) on a second portion of multi-level load board and for connecting said DUT to its multi-level signal and plural power planes, said quiescent test circuit having means for coupling the integrated circuit tester to the integrated circuit device under test (DUT), and said quiescent test circuit having means for switching a low power level to one of said plural power planes of said second portion of said multi-lever load board to allow the integrated circuit test to selectably measure quiescent current consumption of the integrated circuit device under test.

2. The load board of claim 1, wherein said quiescent test circuit has a first input terminal coupled to a plural current level power supply and a second input terminal coupled to the integrated circuit tester, and one output terminal coupled to the integrated circuit device under test; and wherein said quiescent test circuit is operable to select one of said plural current levels to be received at said output terminal.

3. The load board of claim 2, wherein said load board of claim 2, wherein said plural current level power supply provided at said first input terminal are electrically isolated from each other.

4. The load board of claim 2, wherein said integrated circuit tester controls which of said power levels is to be received at said output terminal.

* * * * *